US009470753B2

(12) United States Patent
Bock et al.

(10) Patent No.: US 9,470,753 B2
(45) Date of Patent: Oct. 18, 2016

(54) SYSTEMS AND METHODS FOR TESTING ELECTRONIC DEVICES THAT INCLUDE LOW POWER OUTPUT DRIVERS

(71) Applicant: CASCADE MICROTECH, INC., Beaverton, OR (US)

(72) Inventors: Daniel M. Bock, Beaverton, OR (US); Kenneth R. Smith, Beaverton, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 324 days.

(21) Appl. No.: 14/071,388

(22) Filed: Nov. 4, 2013

(65) Prior Publication Data

US 2014/0125363 A1      May 8, 2014

Related U.S. Application Data

(60) Provisional application No. 61/876,680, filed on Sep. 11, 2013, provisional application No. 61/723,401, filed on Nov. 7, 2012.

(51) Int. Cl.
*G01R 31/28*       (2006.01)
*G01R 31/317*      (2006.01)

(52) U.S. Cl.
CPC ......... *G01R 31/31715* (2013.01); *G01R 31/28* (2013.01)

(58) Field of Classification Search
CPC .... G01R 31/28; G01R 23/16; G01R 31/005; G01R 31/007; G01R 31/024; G01R 31/1272; G01R 15/125; G01R 31/31715; G01R 31/31924; H03K 2217/0036
See application file for complete search history.

(56) References Cited

U.S. PATENT DOCUMENTS

| 5,428,626 | A  | 6/1995  | Frisch et al. |
|-----------|----|---------|---------------|
| 5,488,313 | A  | 1/1996  | Gourse et al. |
| 6,307,363 | B1 | 10/2001 | Anderson      |
| 6,384,615 | B2 | 5/2002  | Schwindt      |

(Continued)

FOREIGN PATENT DOCUMENTS

| TW | 594030        | 6/2004  |
|----|---------------|---------|
| TW | 201003097     | 1/2010  |
| WO | WO 2011/127973 | 10/2011 |

OTHER PUBLICATIONS

English-language abstract of TW594030, Jun. 21, 2004.

(Continued)

*Primary Examiner* — Vinh Nguyen
(74) *Attorney, Agent, or Firm* — Dascenzo Intellectual Property Law, P.C.

(57) ABSTRACT

Systems and methods for testing a device under test (DUT) that includes a low power output driver. The methods include providing an input signal to the DUT. The low power output driver is configured to generate a data signal responsive to receipt of the input signal by the DUT and provide the data signal to a signal analyzer via a data signal transmission line. The methods further include determining an expected data signal to be received from the low power output driver and charging at least a portion of the data signal transmission line with a co-drive output signal that is based, at least in part, on the expected data signal. The methods further include receiving a composite data signal with the signal analyzer. The systems include probe heads with a plurality of data signal transmission lines and a plurality of co-drive conductors.

11 Claims, 3 Drawing Sheets

(56) References Cited

U.S. PATENT DOCUMENTS

| | | | |
|---|---|---|---|
| 6,483,758 B1 * | 11/2002 | Kim | G11C 29/48 365/189.09 |
| 6,501,343 B2 | 12/2002 | Miller | |
| 6,559,671 B2 | 5/2003 | Miller et al. | |
| 7,005,868 B2 | 2/2006 | McTigue | |
| 7,068,057 B2 | 6/2006 | Tervo et al. | |
| 7,474,109 B2 * | 1/2009 | Kuitani | G01R 35/005 324/754.11 |
| 7,733,106 B2 | 6/2010 | Dozier, II et al. | |
| 8,203,351 B2 | 6/2012 | Eldridge et al. | |
| 8,271,226 B2 | 9/2012 | Chakravadhanula et al. | |
| 8,278,953 B2 | 10/2012 | Peschke et al. | |
| 2006/0150047 A1 * | 7/2006 | Nikutta | G01R 31/31922 714/742 |
| 2007/0150224 A1 | 6/2007 | Rivoir | |

OTHER PUBLICATIONS

English-language abstract of TW201003097, Jan. 16, 2010.

* cited by examiner

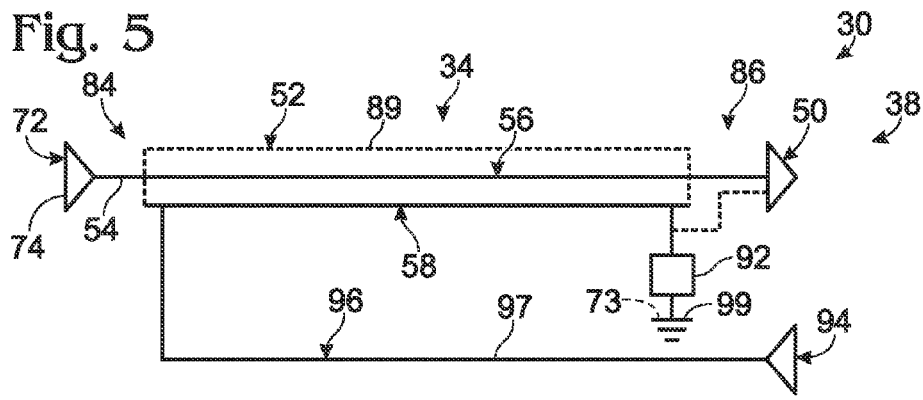
Fig. 5
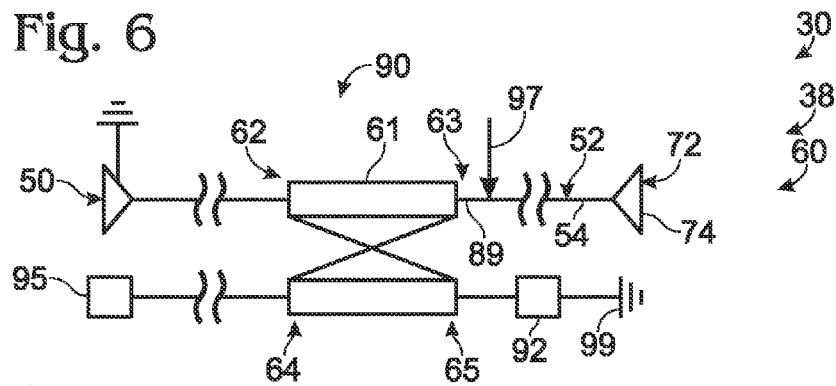
Fig. 6
Fig. 7
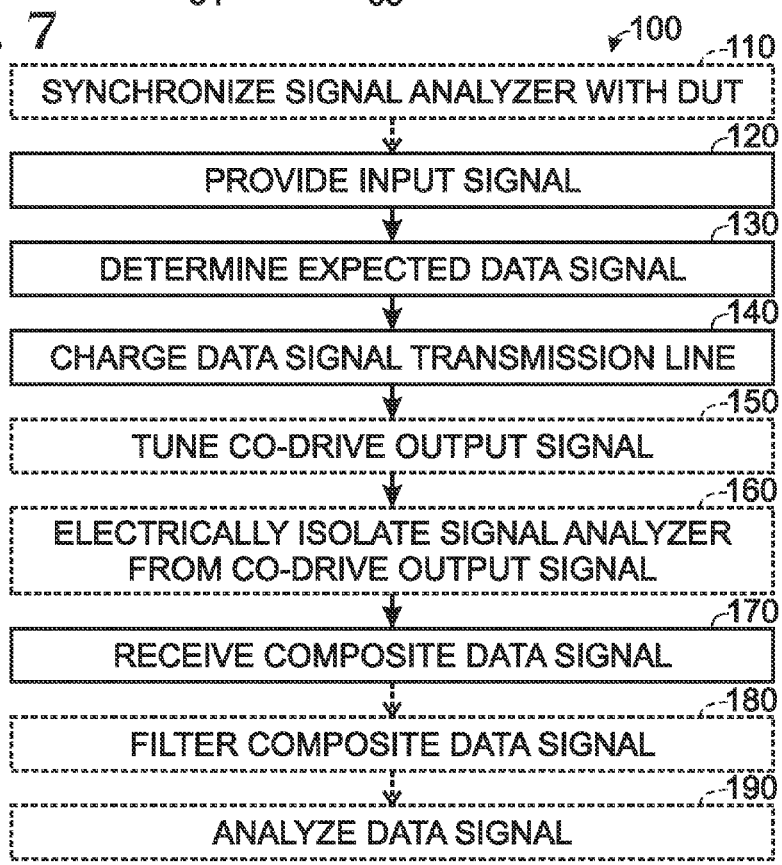

SYSTEMS AND METHODS FOR TESTING ELECTRONIC DEVICES THAT INCLUDE LOW POWER OUTPUT DRIVERS

RELATED APPLICATIONS

This application claims priority to U.S. Provisional Patent Application No. 61/723,401, which was filed on Nov. 7, 2012, and to U.S. Provisional Patent Application No. 61/876,680, which was filed on Sep. 11, 2013. The complete disclosures of the above-identified provisional patent applications are hereby incorporated by reference.

FIELD OF THE DISCLOSURE

The present disclosure is directed generally to testing of electronic devices and more particularly to systems and methods for testing electronic devices that include low power output drivers.

BACKGROUND OF THE DISCLOSURE

Some electronic devices, such as integrated circuit devices that are configured to form a portion of a three-dimensional (3-D) integrated circuit, may be designed to communicate with other electronic devices over very short distances during normal operation thereof. As such, these electronic devices may include small, low power output drivers that may operate at output current levels of a few milliamps or less, with lower output current levels being more common as electronic devices continue to shrink. These low power output drivers may be sufficient to permit communication between the various components of the 3-D integrated circuit (such as between a processor chip and a memory chip thereof) that are separated by distances on the order of a few millimeters or less. However, the low current output from these low power output drivers may present challenges to electronic communication with the low power output drivers over longer distances (such as distances on the order of tens of centimeters to meters).

For example, when a test system is utilized to electronically test an integrated circuit device that includes low power output drivers, it may be necessary to communicate with the low power output drivers over longer distances. This may include transferring low current input signals to the integrated circuit device from the test system and/or receiving low current data signals from the integrated circuit device with the test system, such as via one or more data signal transmission lines. These data signal transmission lines may define lengths of several tens of centimeters or more, with a capacitance of the data signal transmission lines increasing with the length thereof.

Under these conditions, a rise time for a data signal that is conveyed by the data signal transmission lines may be longer than a clock cycle of the integrated circuit device, with the rise time being a result of the resistive-capacitive time delay of the data signal transmission lines. This may complicate receipt, detection, and/or interpretation of the low power data signals. Thus, there exists a need for improved systems and methods for testing electronic devices that include low power output drivers.

SUMMARY OF THE DISCLOSURE

Systems and methods for testing a device under test (DUT) that includes a low power output driver. The methods include providing an input signal to the DUT. The low power output driver is configured to generate a data signal responsive to receipt of the input signal by the DUT and to provide the data signal to a signal analyzer via a data signal transmission line. The methods further include determining an expected data signal to be received from the low power output driver and charging at least a portion of the data signal transmission line with a co-drive output signal that is based, at least in part, on the expected data signal. The methods further include receiving a composite data signal with the signal analyzer.

In some embodiments, the determining the expected data signal includes calculating a characteristic of the expected data signal. In some embodiments, the determining the expected data signal includes determining a magnitude of the input signal, a voltage of the input signal, a current of the input signal, and/or an architecture of the DUT, with such determining based, at least in part, on the input signal.

In some embodiments, the charging includes charging to a co-drive voltage that is based, at least in part, on an expected voltage of the expected data signal. In some embodiments, the charging includes timing the charging such that the signal analyzer receives the data signal and the co-drive output signal at least substantially concurrently. In some embodiments, the charging includes timing the charging such that the signal analyzer receives the co-drive output signal and the data signal within 1 nanosecond of one another. In some embodiments, the providing and the charging are not concurrently initiated.

In some embodiments, the data signal transmission line includes a DUT-proximal end and a signal analyzer-proximal end. In some embodiments, an electrical conductor extends between the DUT-proximal end and the signal analyzer-proximal end. In some embodiments, the charging includes providing the co-drive output signal to the DUT-proximal end. In some embodiments, the charging includes providing the co-drive output current to the signal analyzer-proximal end.

In some embodiments, the data signal transmission line includes a signal conductor and a guard conductor. In some embodiments, the receiving includes receiving the data signal from the signal conductor. In some embodiments, the portion of the data signal transmission line includes the signal conductor. In some embodiments, the portion of the data signal transmission line includes the guard conductor. In some embodiments, the portion of the data signal transmission line includes both the signal conductor and the guard conductor.

In some embodiments, the methods further include tuning the co-drive output signal. In some embodiments, the tuning includes adjusting at least one property of the co-drive output signal. In some embodiments, the tuning includes tuning to calibrate a probe head that includes the data signal transmission line. In some embodiments, the methods further include synchronizing the signal analyzer with the DUT.

The systems include probe heads with a plurality of data signal transmission lines and a plurality of co-drive conductors. The plurality of data signal transmission lines is configured to convey a plurality of data signals from a plurality of low power output drivers on the DUT to a signal generation and analysis assembly (SGAA), and each of the data signal transmission lines includes a DUT-proximal end and an SGAA-proximal end. Each of the plurality of co-drive conductors is in electrical communication with a respective data signal transmission line and is configured to provide a respective co-drive output signal to the respective data signal transmission line. The respective co-drive output signal is based, at least in part, on an expected value of a respective data signal to be conveyed by the respective data signal transmission line.

In some embodiments, the data signal transmission lines each include a signal conductor and a corresponding guard conductor. In some embodiments, each of the plurality of co-drive conductors is directly attached to and in electrical communication with the DUT-proximal end of the respective data signal transmission line. In some embodiments, each of the plurality of co-drive conductors is directly attached to and in electrical communication with the SGAA-proximal end of the respective data signal transmission line. In some embodiments, each of the plurality of co-drive conductors is directly attached to and in electrical communication with a respective guard conductor of the respective data signal transmission line. In some embodiments, each of the plurality of co-drive conductors is directly attached to and in electrical communication with a respective signal conductor of the respective data signal transmission line. In some embodiments, the probe head forms a portion of a test system that further includes the SGAA and a co-drive assembly that is configured to provide the plurality of co-drive signals to the plurality of co-drive conductors.

BRIEF DESCRIPTION OF THE DRAWINGS

FIG. 5 is a schematic representation of illustrative, non-exclusive examples of another transmission line according to the present disclosure.

FIG. 6 is a schematic representation of illustrative, non-exclusive examples of an isolation device that may be utilized with and/or included in the systems and methods according to the present disclosure.

FIG. 7 is a flowchart depicting methods according to the present disclosure of electrically testing a device under test that includes a low power output driver.

DETAILED DESCRIPTION AND BEST MODE OF THE DISCLOSURE

Figure 1:
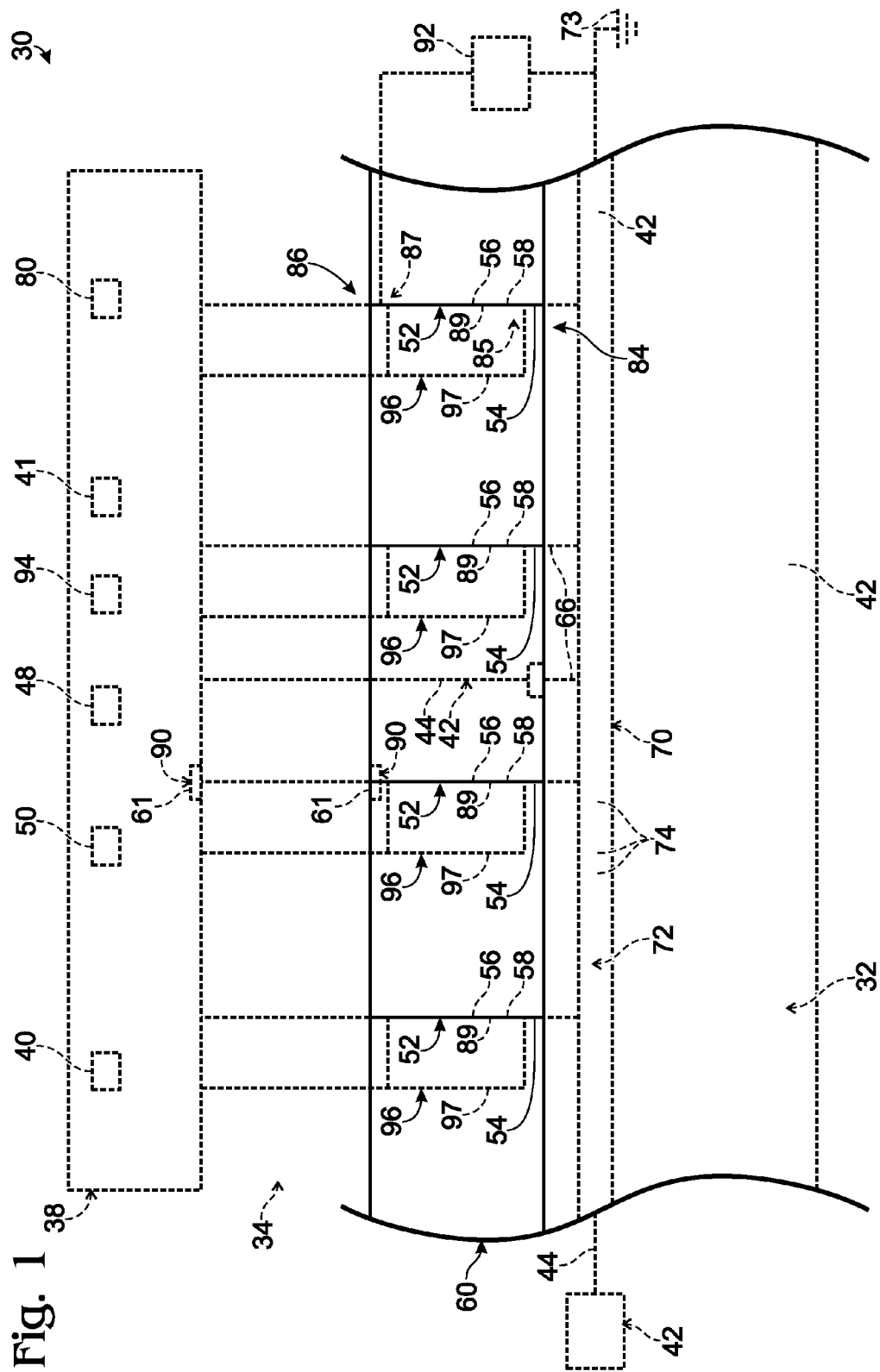
FIG. 1 is a fragmentary, schematic representation of illustrative, non-exclusive examples of a probe head that may be utilized with and/or form a portion of a test system according to the present disclosure.

FIGS. 1-6 provide illustrative, non-exclusive examples of test systems 30, of probe heads 60, of data signals 54, of data signal transmission lines 52, of isolation devices 90, and/or of components thereof that may be included in and/or utilized with the systems and methods according to the present disclosure. Elements that serve a similar, or at least substantially similar, purpose are labeled with like numbers in each of FIGS. 1-6, and these elements may not be discussed in detail herein with reference to each of FIGS. 1-6. Similarly, all elements may not be labeled in each of FIGS. 1-6, but reference numerals associated therewith may be utilized herein for consistency. Elements, components, and/or features that are discussed herein with reference to one or more of FIGS. 1-6 may be included in and/or utilized with any of FIGS. 1-6 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a particular embodiment without departing from the scope of the present disclosure.

FIG. 1 is a schematic representation of illustrative, non-exclusive examples of a probe head 60 according to the present disclosure that may be utilized with and/or form a portion of a test system 30. Probe head 60 includes a plurality of data signal transmission lines 52. The data signal transmission lines are configured to convey a plurality of data signals 54 from a plurality of low power output drivers 74 to a signal generation and analysis assembly (SGAA) 38. The plurality of low power output drivers may form a portion of a device under test (DUT) 72 that may be present on a substrate 70.

Each data signal transmission line 52 includes a DUT-proximal end 84 and a DUT-distal end 86. DUT-distal end 86 also may be referred to herein as signal generation and analysis assembly (SGAA)-proximal end 86. Similarly, DUT-proximal end 84 also may be referred to herein as SGAA-distal end 84. DUT-proximal end 84 may be (electrically) closer to DUT 72 than DUT-distal end 86. DUT-proximal end 84 may be associated with, attached to, directly attached to, operatively affixed to, in direct electrical communication with, and/or in indirect electrical communication with a probe tip 66, which may be configured to electrically contact DUT 72. Conversely, DUT-distal end 86 may be (electrically) farther from DUT 72 than DUT-proximal end 84 and may be associated with, attached to, directly attached to, operatively affixed to, in direct electrical communication with and/or in indirect electrical communication with SGAA 38. When DUT-distal end 86 is in indirect electrical communication with SGAA 38, one or more additional transmission lines 34 may extend between probe head 60 and SGAA 38.

Probe head 60 further includes a plurality of co-drive conductors 96. Each co-drive conductor 96 is in electrical communication with a respective one of the plurality of data signal transmission lines and is configured to provide a respective co-drive output signal 97 to the respective one of the plurality of data signal transmission lines. As discussed in more detail herein, at least one characteristic of each co-drive output signal 97 may be based, at least in part, on an expected value of a respective data signal that 54 that is to be conveyed by a respective data signal transmission line 52 that receives respective co-drive output signal 97. Thus, and as also discussed in more detail herein, co-drive output signals 97 may supplement and/or combine with data signals 54 within data signal transmission lines 52 to produce and/or generate composite data signals 89. Co-drive output signals 97 may be selected to improve a speed and/or accuracy of detection of composite data signals 89 by SGAA 38 when compared to test systems that do not include conductors 96 and/or that directly detect data signals 54.

As illustrated in dashed lines in FIG. 1, probe head 60 also may include one or more input signal supply structures 42. Input signal supply structures 42 may be configured to convey one or more input signals 44 from SGAA 38 to DUT 72. In addition, low power output drivers 74 may be configured to generate the plurality of data signals 54 responsive to receipt of the one or more input data signals.

Input data signal 44 may include and/or be any suitable signal that may cause low power output drivers 74 of DUT 72 to generate data signals 54, either directly or indirectly. This may include any suitable analog signal, digital signal, AC signal, DC signal, wired signal, and/or wireless signal.

As a more specific but illustrative, non-exclusive example, input signal 44 may include a power supply signal that may be configured to provide electrical power (such as an electric current and/or an electric voltage) to DUT 72. As another more specific but illustrative, non-exclusive example, input signal 44 may include a logic signal and/or a test signal that may define one or more states of DUT 72 and/or that may cause DUT 72 to perform one or more operations. As yet another more specific but illustrative, non-exclusive example, input signal 44 may include a self-test initiation signal that may cause, or direct, DUT 72 to perform a self-test.

It is within the scope of the present disclosure that input signal supply structure 42 may include and/or be in any suitable structure. As illustrative, non-exclusive examples, input signal supply structure 42 may include and/or be an input signal transmission line, an input signal electrical conduit, an input signal optical conduit, a wired input signal supply structure, and/or a wireless input signal supply structure.

As also illustrated in dashed lines in FIG. 1, input signal supply structure 42 may be separate and/or distinct from probe head 60. As an illustrative, non-exclusive example, input signal supply structure 42 may form a portion of and/or provide input signal 44 to DUT 72 via a chuck 32. As another illustrative, non-exclusive example, input signal supply structure 42 may form a portion of and/or be integral to DUT 72. As yet another illustrative, non-exclusive example, input signal supply structure 42 may be separate and/or independent from probe head 60, DUT 72, and/or chuck 32.

As illustrated in dashed lines in FIG. 1, each data signal transmission line 52 may include a signal conductor 56 and a respective, or corresponding, guard conductor 58. Signal conductors 56 extend at least between DUT-proximal end 84 and SGAA-proximal end 86 of data signal transmission lines 52 and are configured to convey data signals 54 from low power output drivers 74 to SGAA 38. Guard conductors 58 extend at least partially between DUT-proximal end 84 and SGAA-proximal end 86 and are configured to guard respective signal conductors 56 and/or to provide ground paths for respective signal conductors 56. Signal conductors 56 may be spaced apart and/or electrically isolated from one another (at least within probe head 60). Similarly, guard conductors 58 may be spaced apart and/or electrically isolated from one another (at least within probe head 60).

Data signal transmission lines 52 may include and/or be defined by any suitable structure. As an illustrative, non-exclusive example, data signal transmission lines 52 may include and/or be a plurality of parallel conductors that define both signal conductors 56 and guard conductors 58. As another illustrative, non-exclusive example, data signal transmission lines 52 may include and/or be a plurality of coaxial conductors that define both signal conductors 56 and guard conductors 58.

During operation of probe head 60, and as discussed in more detail herein, it may be desirable to provide co-drive output signal 97 to data signal transmission line 52 at, or near, SGAA-proximal end 86, to reflect co-drive output signal 97 at, or near, DUT-proximal end 84, and to return co-drive output signal 97 to SGAA-proximal end 86 and/or to SGAA 38. Under these conditions, it is within the scope of the present disclosure that a length of data signal transmission line 52 and/or of signal conductor 56 and/or guard conductor 58 thereof may not be an integer multiple of a wavelength of a respective co-drive output signal 97 that may be conveyed thereby.

As an illustrative, non-exclusive example, the length of the data signal transmission line, the signal conductor, and/or the guard conductor may be an integer multiple of the wavelength of the co-drive output signal plus a threshold fraction of the wavelength of the co-drive output signal. Illustrative, non-exclusive examples of the threshold fraction include threshold fractions of at least 25%, at least 30%, at least 35%, at least 40%, at least 45%, or at least 50% of the wavelength of the co-drive output signal. Additional illustrative, non-exclusive examples of the threshold fraction include threshold fractions of less than 80%, less than 75%, less than 70%, less than 65%, less than 60%, less than 55%, or less than 50% of the wavelength of the co-drive output signal. An additional illustrative, non-exclusive example of the threshold fraction is a threshold fraction of 50% of the wavelength of the co-drive output signal.

As discussed, each signal conductor 56 may have a corresponding, or respective, guard conductor 58 associated therewith. It is within the scope of the present disclosure that each guard conductor may guard a respective signal conductor, or even a single signal conductor.

As discussed, guard conductors 58 extend at least partially between DUT-proximal end 84 and SGAA-proximal end 86, and each guard conductor 58 may extend along at least a threshold fraction of a length of a corresponding data signal transmission line 52. Illustrative, non-exclusive examples of the threshold fraction include threshold fractions of at least 50%, at least 60%, at least 70%, at least 80%, at least 90%, at least 95%, at least 97.5%, or at least 99% of the length of the corresponding data signal transmission line 52.

Guard conductor 58 may be electrically isolated from substrate 70, DUT 72, low power output drivers 74, and/or a DUT ground 73 thereof. Additionally or alternatively, and as illustrated in dashed lines in FIG. 1, guard conductor 58 may be in indirect electrical communication with substrate 70, DUTs 72, output drivers 74, and/or a DUT ground 73, such as via one or more electrical elements 92. Illustrative, non-exclusive examples of electrical elements 92 include any suitable resistor, capacitor, inductor, and/or transistor.

Conventional transmission lines that may be utilized to electrically test a DUT that includes higher power output drivers, such as drivers with an output current of 20-30 mA, may include, define, and/or have an impedance of 50-75 ohms. It is within the scope of the present disclosure that transmission lines according to the present disclosure that extend between DUT 72 and SGAA 38 (such as data signal transmission lines 52, input signal supply structure 42, transmission lines 34, and/or any suitable combination thereof) also may include an impedance of 50-75 ohms. However, it also is within the scope of the present disclosure that the transmission lines may include a higher impedance. As illustrative, non-exclusive examples, the transmission lines may include an impedance of greater than 75 ohms, greater than 80 ohms, greater than 85 ohms, greater than 90 ohms, or greater than 95 ohms. Additionally or alternatively, the transmission lines may include an impedance of less than 125 ohms, less than 120 ohms, less than 115 ohms, less than 110 ohms, or less than 105 ohms. As yet another illustrative, non-exclusive example, the transmission lines may include an impedance of approximately, or nominally, 50 ohms, 75 ohms, or 100 ohms.

Co-drive conductors 96 are illustrated in dashed lines in FIG. 1 to indicate that the co-drive conductors may be electrically attached to, in electrical communication with, directly attached to, in physical contact with, and/or affixed to any suitable portion of data signal transmission lines 52. As an illustrative, non-exclusive example, and as indicated at 85, co-drive conductors 96 may be affixed to, or near, DUT-proximal end 84 of data signal transmission lines 52. As another illustrative, non-exclusive example, and as indicated at 87, co-drive conductors 96 may be affixed to, or near, SGAA-proximal end 86 of data signal transmission lines 52.

When co-drive conductor 96 is affixed to DUT-proximal end 84, and upon receipt of a corresponding co-drive output signal 97 from the co-drive conductor, data signal transmission line 52 may be configured to convey the co-drive output signal from the DUT-proximal end to the SGAA-proximal end at least partially concurrently with conveyance of a data signal 54 within the data signal transmission line. Thus, the co-drive output signal and the data signal may interact with one another and/or may combine within the data signal transmission line, thereby generating composite data signal 89 and/or improving detection of data signal 54 by SGAA 38.

When co-drive conductor 96 is affixed to SGAA-proximal end 86, and upon receipt of a corresponding co-drive output signal 97 from the co-drive conductor, data signal transmission line 52 may be configured to convey the co-drive output signal from the SGAA-proximal end to the DUT-proximal end and to reflect the co-drive output signal at, or near, the DUT-proximal end. The data signal transmission line then may return the co-drive output signal to the SGAA-proximal end at least partially concurrently with conveyance of a data signal 54 within the data signal transmission line. Thus, the co-drive output signal and the data signal may interact with one another and/or may combine within the data signal transmission line, thereby generating composite data signal 89 and/or improving detection of data signal 54 by SGAA 38.

It is within the scope of the present disclosure that co-drive conductor 96 may provide co-drive output signal 97 to any suitable component of data signal transmission line 52. As an illustrative, non-exclusive example, the co-drive conductor may provide the co-drive output signal to signal conductor 56. When co-drive conductor 96 provides co-drive output signal 97 to signal conductor 56, test system 30 and/or probe head 60 thereof further may include an isolation device 90.

Isolation device 90 may be located between SGAA 38 and a location where co-drive output signal 97 is provided to signal conductor 56. Furthermore, isolation device 90 may be configured to isolate SGAA 38 from co-drive output signal 97 when, or while, the co-drive output signal is being provided to the signal conductor. However, isolation device 90 may be configured to permit composite data signal 89 to reach SGAA 38 from probe head 60, thereby permitting detection and/or analysis of the composite data signal by the signal generation and analysis assembly. Illustrative, non-exclusive examples of isolation device 90 include any suitable directional coupler, matrix directional coupler, and/or four-way coupler. More specific but still illustrative, non-exclusive examples of an isolation device 90, in the form of a four-way coupler 61, are discussed in more detail herein with reference to FIG. 6.

As another illustrative, non-exclusive example, the co-drive conductor may provide the co-drive output signal to guard conductor 58. When the co-drive output signal is provided to DUT-proximal end 84 of guard conductor 58, test system 30 and/or probe head 60 thereof further may include an electrical connection between SGAA-proximal end 86 of guard conductor 58 and DUT ground 73 via electrical element 92. This may permit co-drive output signal 97 to be conveyed through guard conductor 58 at least partially in parallel with conveyance of data signal 54 through signal conductor 56, thereby decreasing a resistive-capacitive delay of data signal 54.

As discussed, data signal 54 and co-drive output signal 97 may combine within data signal transmission line 52 to produce and/or generate composite signal 89. It is within the scope of the present disclosure that composite signal 89 may include and/or be any suitable combination of data signal 54 and co-drive output signal 97. As an illustrative, non-exclusive example, and when co-drive output signal 97 is provided to signal conductor 56, the data signal and the co-drive output signal may combine, intermingle, and/or be added together within the signal conductor to generate the composite data signal. Under these conditions, both data signal 54 and co-drive output signal 97 physically may be provided to SGAA 38 as composite signal 89.

As another illustrative, non-exclusive example, and when co-drive output signal 97 is provided to guard conductor 58, the data signal and the co-drive output signal may not physically combine within data transmission line 52. Instead, electric and/or magnetic fields that may be generated by flow of data signal 54 through signal conductor 56 and/or by flow of co-drive output signal 97 through guard conductor 58 may interact with one another, thereby changing both the data signal and the co-drive output signal as the signals flow through the data transmission line. As an illustrative, non-exclusive example, the presence of co-drive output signal 97 within guard conductor 58 may "pre-charge" the guard conductor. The guard conductor may be oriented proximal to and/or in capacitive communication with the signal conductor. Thus, this "pre-charge" may decrease the resistive-capacitive delay experienced by data signal 54 as the data signal travels through the signal conductor. Under these conditions, co-drive output signal 97 may not be provided directly to SGAA 38 with composite data signal 89. Instead, co-drive output signal 97 may modify data signal 54 to produce composite data signal 89.

Signal generation and analysis assembly 38 may include a signal generator 40, which may be configured to generate one or more input signals 44. Input signals 44 may be provided to DUT 72 via input signal supply structure 42 and/or probe head 60. The signal generation and analysis assembly also may include a signal analyzer 50. Signal analyzer 50 may be configured to receive one or more data signals 54 from DUT 72 via data signal transmission lines 52.

Signal generation and analysis assembly 38 may include any suitable structure that is configured to form a plurality of electrical connections with transmission lines 34, convey the plurality of input signals 44 from signal generator 40 to input signal supply structure 42, and/or convey the plurality of data signals 54 from data signal transmission lines 52 to signal analyzer 50. As illustrative, non-exclusive examples, signal generation and analysis assembly 38 may include one or more electrical conduits, switches, and/or transistors.

Signal generator 40 may include any suitable structure that is configured to generate input signals 44. As discussed, DUT 72 may include low power output drivers 74 and may be configured to send and/or receive low power electric signals. Thus, signal generator 40 may include a plurality of low power input drivers that are configured to generate the plurality of input signals 44 (which may be subsequently conveyed to DUT 72 via input signal supply structure 42). A current may be at least substantially similar to the output current of low power output drivers 74, illustrative, non-exclusive examples of which are discussed in more detail herein. The current additionally or alternatively may be referred to herein as an electric current and/or an input current of input signals 44.

Signal analyzer 50 may include any suitable structure that is configured to receive the plurality of data signals 54 from data signal transmission lines 52 and to quantify and/or analyze one or more properties thereof. As illustrative, non-exclusive examples, signal analyzer 50 may quantify any suitable voltage, current, frequency, and/or phase of one or more of the plurality of data signals 54. As additional illustrative, non-exclusive examples, signal analyzer 50 may include and/or be an impedance analyzer, a network analyzer, a bit error rate tester, and/or a spectrum analyzer.

As a further illustrative, non-exclusive example, signal analyzer 50 may include a filter 48. Filter 48 may be configured to separate the plurality of co-drive output signals from the plurality of composite signals to generate a plurality of filtered composite signals. The plurality of filtered composite signals may correspond to the plurality of data signals, and signal analyzer 50 may be configured to analyze the plurality of filtered data signals.

It is within the scope of the present disclosure that test system 30 may include specific, designated, and/or dedicated input signal supply structures 42 and data signal transmission lines 52. Under these conditions, signal generation and analysis assembly 38 may directly and electrically connect signal generator 40 thereof with input signal supply structure 42. Signal generation and analysis assembly 38 also may directly and electrically connect signal analyzer 50 thereof with data signal transmission lines 52.

However, it also is within the scope of the present disclosure that at least a portion of transmission lines 34 may function as both input signal supply structure 42 and data signal transmission lines 52. Under these conditions, signal generation and analysis assembly 38 may include a switching structure 41 that may be configured to selectively connect a selected one of the transmission lines to signal generator 40 (such as when the transmission line is, or functions as, an input signal supply structure) or to signal analyzer 50 (such as when the transmission line is, or functions as, a data signal transmission line). Additionally or alternatively, signal generator 40 and signal analyzer 50 may be a single structure, and individual transmission lines 34 may provide two-way communication therewith.

As illustrated in dashed lines in FIG. 1, test system 30 and/or signal generation and analysis assembly 38 thereof further may include a co-drive assembly 94. Co-drive assembly 94 may be configured to provide the plurality of co-drive output signals 97 to the plurality of co-drive conductors 96.

As discussed in more detail herein, a magnitude, voltage, current, power, waveform, phase, and/or timing of co-drive output signals 97 may be selected to supplement respective data signals 54, such as to decrease a rise time of data signals 54 and/or to permit data signals 54 to be above an upper voltage threshold and/or below a lower voltage threshold within a specified time period (such as may be defined by a clock cycle of DUT 72). This may permit data signals 54 that are received by signal generation and analysis assembly 38 to define a valid logic state within the specified time period (as discussed in more detail herein with reference to FIGS. 2-3), thereby permitting testing of DUT 72 that includes low power output drivers 74 via (relatively) longer data signal transmission lines 52. Stated another way, co-drive output signals 97 may be selected to pre-charge data signal transmission lines 52 to a large percentage of a predicted voltage, thereby assisting low power output drivers 74 in reaching the upper voltage threshold and/or the lower voltage threshold within a target period of time (such as within the clock cycle of DUT 72).

With this in mind, co-drive assembly 94 also may be referred to herein as and/or may be a pre-drive assembly 94, a pre-charge assembly 94, a weak driver pre-charge (WDP) assembly 94, a guard assembly 94, and/or a supplemental drive assembly 94. Similarly, co-drive output signals 97 also may be referred to herein as and/or may be pre-drive output signals 97, pre-charge signals 97, weak driver pre-charge (WDP) signals 97, guard signals 97, and/or supplemental-drive output signals 97.

The selection of the magnitude, voltage, current, power, waveform, phase, and/or timing of co-drive output signals 97 may be performed by any suitable structure, such as by signal generation and analysis assembly 38 and/or by co-drive assembly 94, and may be based upon any suitable criteria. As an illustrative, non-exclusive example, co-drive assembly 94 may be configured to determine a plurality of expected data signals to be generated by the plurality of low power output drivers, and the magnitude, voltage, current, power, phase, and/or timing of co-drive output signals 97 may be selected based upon a magnitude, voltage, current, power, phase, and/or timing of the plurality of expected data signals.

Test system 30 further may include chuck 32, which may be configured to hold, support, and/or locate substrate 70, and a controller 80, which may be programmed to control the operation of at least a portion of the test system. As an illustrative, non-exclusive example, controller 80 may be adapted, configured, designed, selected, and/or programmed to control the operation of test system 30 by performing methods 100, which are discussed in more detail herein.

FIG. 1 illustrates DUT 72 as being formed and/or present on substrate 70. It is within the scope of the present disclosure that substrate 70 may include a plurality of DUTs 72, such as when substrate 70 includes and/or is a semiconductor wafer. However, it also is within the scope of the present disclosure that substrate 70 may include a single DUT 72, such as a DUT 72 that has been singulated from the semiconductor wafer. Illustrative, non-exclusive examples of DUTs 72 according to the present disclosure include any suitable semiconductor device, electronic device, microprocessor, integrated circuit, memory device, logic device, mixed signal device, and/or controller.

Regardless of the particular configuration, DUT 72 includes a plurality of low power output drivers 74 that are configured to generate the plurality of data signals, which may be provided to a circuit and/or device that is external to DUT 72. As an illustrative, non-exclusive example, DUT 72 may include and/or be a portion of a three-dimensional (3-D) integrated circuit, and test system 30 may be configured to test the operation and/or functionality of DUT 72 prior to DUT 72 being assembled with one or more other integrated circuit devices that may be formed on different substrate(s) to generate the 3-D integrated circuit.

As another illustrative, non-exclusive example, DUT 72 may include and/or be a memory chip that includes a plurality of memory cells and which is configured to form a portion of the 3-D integrated circuit. Under these conditions, input signals 44 may include write signals, which may be configured to define, set, and/or assign a logic state of the memory cells, and/or read signals, which may be configured to request the logic state of the memory cells from the memory chip. Thus, when the memory chip receives one or more write signals, the logic state of one or more memory cells may be defined, set, and/or assigned to a value that corresponds to the one or more write signals. Similarly, when the memory receives one or more read signals, the logic state of one or more memory cells may be transmitted from the memory chip via low power output drivers 74 as data signals 54.

When DUT 72 is assembled within the 3-D integrated circuit, a distance over which the electric signals that are produced thereby must travel may be relatively short (such as on the order of a few millimeters to a few tens of millimeters), as DUT 72 may be bonded and/or attached directly to another integrated circuit device and may communicate therewith. As illustrative, non-exclusive examples, the electric signals may travel relatively short distances of less than 5 cm, less than 4.5 cm, less than 4 cm, less than 3.5 cm, less than 3 cm. less than 2.5 cm, less than 2 cm, less than 1.5 cm, less than 1 cm, less than 0.75 cm, less than 0.5 cm, and/or less than 0.25 cm.

However, when DUT 72 is being tested by test system 30, the low output current of low power output drivers 74 may present unique challenges to the measurement of the data signals that are produced thereby due to the longer distances that these signals must travel within the test system. This is discussed in more detail herein with reference to FIGS. 2-3. As illustrative, non-exclusive examples, the longer distances may include distances of at least 10 cm, at least 15 cm, at least 20 cm, at least 25 cm, at least 30 cm, at least 40 cm, at least 50 cm, at least 60 cm, at least 70 cm, at least 80 cm, at least 90 cm, at least 100 cm, at least 125 cm, at least 150 cm, at least 175 cm, and/or at least 200 cm.

Low power output drivers 74 may be designed and/or configured to produce data signals 54 with a low current, which also may be referred to herein as an electric current and/or output current of the low power output drivers. As illustrative, non-exclusive examples, the output current from low power output drivers 74 may be less than 10 milliamps (mA), less than 9 mA, less than 8 mA, less than 7 mA, less than 6 mA, less than 5 mA, less than 4 mA, less than 3 mA, less than 2.5 mA, less than 2 mA, less than 1.75 mA, less than 1.5 mA, less than 1.25 mA, and/or less than 1 mA. Additionally or alternatively, the output current from low power output drivers 74 may be greater than 0.1 mA, greater than 0.2 mA, greater than 0.3 mA, greater than 0.4 mA, greater than 0.5 mA, greater than 0.75 mA, greater than 1 mA, greater than 1.25 mA, and/or greater than 1.5 mA.

DUT 72 may be designed, configured, and/or constructed to operate at a frequency, or DUT frequency, which may define a number of cycles, or operations, that may be performed by the DUT during a given timeframe. As illustrative, non-exclusive examples, the DUT frequency may be greater than 50 megahertz (MHz), greater than 75 MHz, greater than 100 MHz, greater than 125 MHz, greater than 150 MHz, greater than 175 MHz, greater than 200 MHz, greater than 300 MHz, greater than 400 MHz, greater than 500 MHz, greater than 750 MHz, greater than 1 gigahertz (GHz), and/or greater than 2 GHz. Additionally or alternatively, the DUT frequency may be less than 5 GHz, less than 4 GHz, less than 3 GHz, less than 2 GHz, less than 1 GHz, less than 750 MHz, less than 500 MHz, less than 400 MHz, less than 350 MHz, less than 325 MHz, less than 300 MHz, less than 275 MHz, less than 250 MHz, and/or less than 225 MHz. This may include DUTs 72 that may operate at a nominal frequency of 200 MHz.

The DUT frequency may define a clock cycle, or clock time, for the DUT, which may be defined as an inverse of the DUT frequency. As an illustrative, non-exclusive example, when the DUT frequency is 200 MHz, each clock cycle may define a time period of 5E-9 seconds, or 5 nanoseconds (ns).

Figure 2:
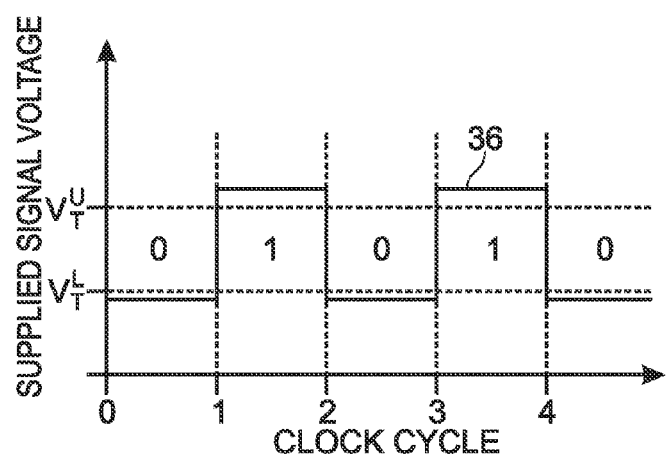
FIG. 2 is a schematic representation of voltage vs. clock cycle for a low current electric signal that is supplied to a transmission line.
Figure 3:
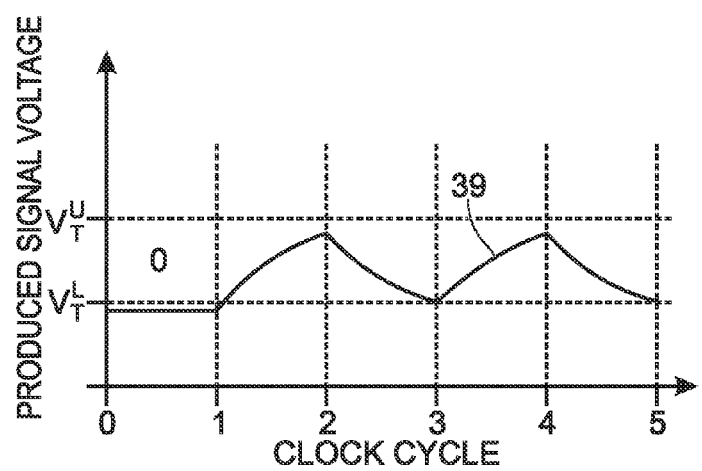
FIG. 3 is a schematic representation of voltage vs. clock cycle for a low current electric signal that is produced from a transmission line.

FIG. 2 is a schematic representation of voltage vs. clock cycle for a low power electric signal that is supplied to a transmission line, while FIG. 3 is a schematic representation of voltage vs. clock cycle for a low power electric signal that is produced from a transmission line. The behavior of the data signals that are discussed herein with reference to FIGS. 2-3 may be experienced within transmission lines that do not utilize co-drive conductors and/or co-drive output signals according to the present disclosure.

In FIG. 2, a low power electric signal 36 that is supplied to a first end of the transmission line, which also may be referred to herein as supplied electric signal 36, is represented in an idealized fashion as a series of step changes between two different voltage values, with each step change occurring at the beginning of a respective clock cycle. As illustrated in FIG. 2, when the voltage of the low power electric signal is greater than an upper voltage threshold (indicated by $V_T^U$), a "1" logic state is indicated by the low power electric signal. Similarly, and when the voltage of the low power electric signal is less than a lower voltage threshold (indicated by $V_T^L$), a "0" logic state is indicated by the low power electric signal. In FIG. 2, these logic states are clearly defined.

In contrast, FIG. 3 is an illustrative, non-exclusive example of voltage vs. clock cycle for the low power electric signal of FIG. 2, which also may be referred to herein as a produced electric signal 39, as measured at and/or produced from a second end of the transmission line. As illustrated in FIG. 3, the voltage is in a steady state and defines a "0" logic state (i.e., is less than $V_T^L$) in clock cycle 0. In clock cycle 1, supplied electric signal 36 step changes to a voltage that defines the "1" logic state (as illustrated in FIG. 2). However, produced electric signal 39 does not exhibit a step change in voltage. Instead, the produced electric signal exhibits a monotonic rise with time during the first clock cycle. This behavior may be due to resistive-capacitive time delays within the transmission line, and a time for the produced electric signal to reach $V_T^U$ (or, alternatively, a time for the produced electric signal to transition from a steady state condition that defines a "1" logic state to a voltage that is lower than $V_T^L$) may be referred to herein as a rise time for produced electric signal 39. In FIG. 3, the rise time for produced electric signal 39 is greater than a time span of an individual clock cycle. Thus, and since supplied electric signal 36 transitions between the "0" and the "1" logic state with each clock cycle, produced electric signal 39 exhibits a quasi-sawtooth waveform and fails to define a valid logic state (since the voltage that is produced from the second end of the transmission line remains between $V_T^L$ and $V_T^U$).

A rise time of a low power electric signal in a transmission line may be impacted by a variety of system parameters. As an illustrative, non-exclusive example, increasing a capacitance of the transmission line (such as by increasing a length thereof and/or by locating the transmission line proximal to other transmission lines) may increase the rise time. This may be due to the increased charge (i.e., increased number of electrons) that may be needed to charge the capacitance of the transmission line. As another illustrative, non-exclusive example, increasing a resistance of the transmission line may decrease the rise time. This may be due to the increased resistance to current flow through the transmission line, which may increase a rate at which the capacitance of the transmission line may be charged. As yet another illustrative, non-exclusive example, the rise time may increase or decrease with an increase or decrease, respectively, in the electronic current that is conveyed thereby. As yet another illustrative, non-exclusive example, the rise time may be impacted by a material of construction, orientation, shape, and/or cross-sectional area of the transmission line.

FIGS. 2-3 illustrate that it may be challenging to electronically test a DUT when the rise time of the low power electric signals that may be conveyed within the transmission lines is similar to or larger than a cycle time for a clock cycle of the DUT. These issues further may be complicated when a test system includes a plurality of transmission lines that are configured to convey a plurality of low power electric signals from a plurality of low power output drivers of the DUT, as a rise time of each of the plurality of low power electric signals may differ from a rise time of at least one other of the plurality of low power electric signals, which may complicate simultaneous detection of the plurality of low power electric signals.

As an illustrative, non-exclusive example, a rise time of a first electric signal in a first transmission line may be different from a rise time of a second electric signal in a second transmission line. As another illustrative, non-exclusive example, an output power of a first low power output driver may be different from an output power of a second low power output driver, thereby producing a different rise time in otherwise similar transmission lines.

Figure 4:
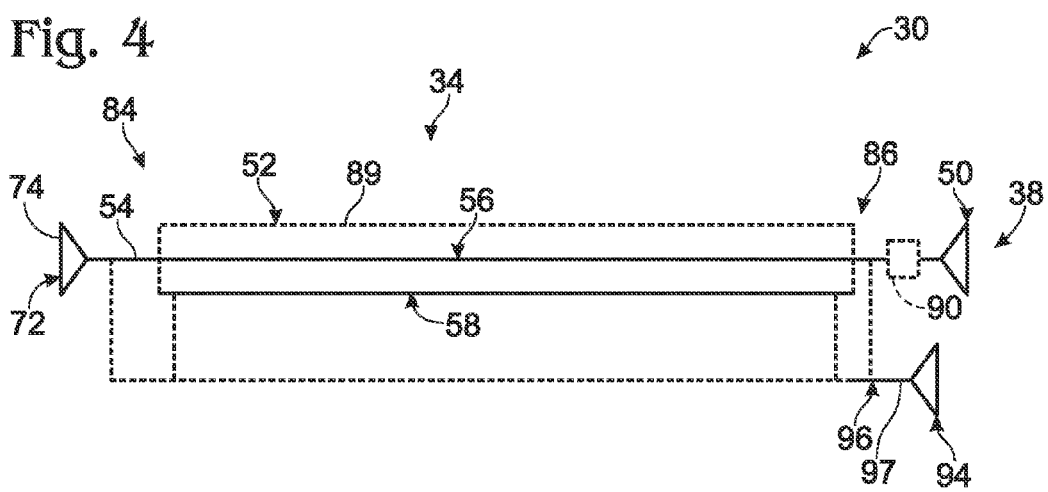
FIG. 4 is a schematic representation of illustrative, non-exclusive examples of a transmission line according to the present disclosure.

FIG. 4 is a schematic representation of illustrative, non-exclusive examples of a transmission line 34 according to the present disclosure. Transmission line 34 of FIG. 4 may include and/or be data signal transmission line 52 of FIG. 1. FIG. 4 illustrates an example of a signal conductor 56 of a data signal transmission line 52 that interconnects a low power output driver 74 of a DUT 72 with a signal analyzer 50 of a signal generation and analysis assembly 38. In addition, a guard conductor 58 forms a portion of data signal transmission line 52 and extends along at least a portion of a length of signal conductor 56.

Guard conductor 58 extends at least substantially parallel to signal conductor 56, such as when guard conductor 58 and signal conductor 56 are parallel wires. Additionally or alternatively, data signal transmission line 52 may include and/or be a coaxial data signal transmission line, and guard conductor 58 may extend around signal conductor 56, as illustrated in dashed lines.

A co-drive assembly 94 may be electrically connected (as illustrated in dashed lines) to signal conductor 56 and/or to a guard conductor 58 via a co-drive conductor 96. Co-drive assembly 94 may be configured to provide a co-drive output signal 97 to signal conductor 56 and/or to guard conductor 58 via co-drive conductor 96. As illustrated in dashed lines, co-drive conductor 96 may provide co-drive output signal 97 to any suitable portion of signal conductor 56 and/or guard conductor 58, such as to a DUT-proximal end 84 and/or to a SGAA-proximal end 86 thereof. When co-drive conductor 96 provides co-drive output signal 97 to signal conductor 56, an isolation device 90 may be located between signal conductor 56 and signal analyzer 50, and isolation device 90 may be configured to selectively restrict supply of co-drive output signal 97 to the data analyzer.

In operation, low power output driver 74 may generate a data signal 54, which may be provided to signal conductor 56 of data signal transmission line 52. In addition, co-drive assembly 94 may generate co-drive output signal 97, which may be provided to any suitable portion of data signal transmission line 52. Data signal 54 and co-drive output signal 97 may combine within data signal transmission line 52 to generate a composite data signal 89, which may be provided to signal analyzer 50. In addition, and as also discussed, at least one property of co-drive output signal 97 may be based, at least in part, on an expected property of data signal 54, with the property of the co-drive output signal being selected such that the co-drive output signal supplements the data signal and/or improves detection of the composite data signal by signal analyzer 50.

FIG. 5 is a schematic representation of illustrative, non-exclusive examples of another transmission line 34 according to the present disclosure. Transmission line 34 of FIG. 5 may include and/or be data signal transmission line 52 of FIG. 1.

In FIG. 5, a signal conductor 56 of data signal transmission line 52 interconnects a low power output driver 74 of a DUT 72 with a signal analyzer 50 of a signal generation and analysis assembly 38. In addition, a co-drive assembly 94 is electrically connected to a DUT-proximal end 84 of a guard conductor 58 of data signal transmission line 52 via a co-drive conductor 96. A signal generation and analysis assembly-proximal end 86 of guard conductor 58 further is electrically connected to a ground, or ground plane, 99 (such as a DUT ground 73 of DUT 72) via an electrical element 92, such as a resistor.

In operation, low power output driver 74 may generate a data signal 54, which may be provided to signal conductor 56 of data transmission line 52. In addition, co-drive assembly 94 may generate a co-drive output signal 97, which may be provided to DUT-proximal end 84 of guard conductor 58 via co-drive conductor 96. The data signal and the co-drive output signal may be at least partially concurrently conveyed from DUT-proximal end 84 to SGAA-proximal end 86, and the presence of co-drive output signal 97 within guard conductor 58 may decrease a resistive-capacitive time delay for conveyance of data signal 54 through signal conductor 56 and generate composite data signal 89. Subsequently, composite data signal 89 may be provided to signal analyzer 50, while co-drive output signal 97 may be conveyed to ground 99 via electrical element 92.

The systems and methods disclosed herein have been discussed in the context of a test system that is configured to test a DUT and/or of methods of testing the DUT. However, it is within the scope of the present disclosure that the systems and methods disclosed herein also may be utilized to characterize, or pre-characterize, any suitable portion of a test system, such as to generate pre-characterization data. This pre-characterization data then may be utilized with test systems 30 and/or while performing methods 100 that are disclosed herein.

As an illustrative, non-exclusive example, a pre-characterization system may be utilized to generate pre-characterization data that is related to the operation and/or performance of test system 30, transmission lines 34, and/or probe head 60. This pre-characterization data then may be stored, such as within test system 30, within a data storage medium/device that is in communication with test system 30, within a suitable database, on a suitable data storage medium, within a memory chip, and/or within a data cloud. Subsequently, operation of test system 30 and/or performance of methods 100 may include accessing and/or utilizing the pre-characterization data. Under these conditions, the pre-characterization system may have a greater accuracy and/or precision than test system 30, thereby permitting more accurate and/or precise characterization of the performance thereof prior to use of test system 30 to test the DUT.

FIG. 6 is a schematic representation of illustrative, non-exclusive examples of an isolation device 90 that may be utilized with and/or included in the systems and methods according to the present disclosure. Isolation device 90 includes a four-way coupler 61 that includes a first port 62, a second port 63, a third port 64, and a fourth port 65. First port 62 may be electrically coupled to a signal analyzer 50. Second port 63 may be electrically coupled to a low power output drive 74 of a DUT 72 via a data signal transmission line 52. Third port 64 may be electrically coupled to a subtraction circuit 95. Fourth port 65 may be electrically coupled to a ground 99 via an electrical element 92, such as a resistor.

In operation, subtraction circuit 95 may regulate the operation of four-way coupler 61 to restrict flow of a co-drive output signal 97 to signal analyzer 50. However, four-way coupler 61 may permit a data signal 54 and/or a composite data signal 89 to flow therethrough and/or to signal analyzer 50.

FIG. 7 is a flowchart depicting methods 100 according to the present disclosure of electrically testing a device under test (DUT) that includes a low power output driver. Methods 100 may include synchronizing a signal analyzer with the DUT at 110. Methods 100 include providing an input signal to the DUT at 120 and determining an expected data signal to be received from a low power output driver of the DUT at 130. Methods 100 further include charging a data signal transmission line with a co-drive output signal at 140 and may include tuning the co-drive output signal at 150 and/or electrically isolating a signal analyzer from the co-drive output signal at 160. Methods 100 further include receiving a composite data signal with the signal analyzer at 170 and may include filtering the composite data signal at 180 and/or analyzing a data signal at 190.

Synchronizing the signal analyzer with the DUT at 110 may be accomplished in any suitable manner. As an illustrative, non-exclusive example, the synchronizing at 110 may include determining and/or detecting an operational frequency of the DUT and/or synchronizing at, or to, the operational frequency of the DUT. As another illustrative, non-exclusive example, the synchronizing at 110 may include determining and/or detecting a clock signal of the DUT with the signal analyzer. As yet another illustrative, non-exclusive example, the synchronizing at 110 may include determining and/or detecting a clock signal of the input signal with the signal analyzer. As another illustrative, non-exclusive example, the synchronizing at 110 may include providing a preliminary input signal to the DUT and determining and/or detecting a resultant preliminary data signal from the DUT prior to performing the determining at 130, the charging at 140, and/or the receiving at 170.

Providing the input signal to the DUT at 120 may include providing any suitable input signal to the DUT in any suitable manner. As an illustrative, non-exclusive example, the providing at 120 may include providing the input signal via an input signal supply structure. Illustrative, non-exclusive examples of the input signal supply structure are disclosed herein with reference to input signal supply structure 42. Illustrative, non-exclusive examples of the input signal are disclosed herein with reference to input signal 44. The DUT may be configured to receive the input signal. The low power output driver may be configured to generate the data signal responsive to receipt of the input signal by the DUT and to provide the data signal to the signal analyzer via the data signal transmission line.

Determining the expected data signal to be received from the low power output driver of the DUT at 130 may include determining any suitable expected property, or characteristic, of the data signal that is generated by the low power output driver in response to receipt of the input signal by the DUT. This may include determining the expected data signal in any suitable manner and/or based upon any suitable criteria.

As an illustrative, non-exclusive example, the determining at 130 may include determining, or calculating, the expected data signal based upon the input signal, a voltage of the input signal, and/or a current of the input signal. As another illustrative, non-exclusive example, the determining at 130 may include determining, or calculating, the expected data signal based upon an architecture of the DUT. As yet another illustrative, non-exclusive example, the determining at 130 also may include obtaining a predetermined expected data signal from any suitable source, such as from a look-up table and/or from a memory or data storage device. As another illustrative, non-exclusive example, the determining at 130 may include modeling the DUT. As yet another illustrative, non-exclusive example, the determining at 130 may include measuring a preliminary data signal that is produced by the DUT responsive to receipt of a preliminary input signal. Illustrative, non-exclusive examples of the property, or characteristic, of the expected data signal include a voltage of the expected data signal, a current of the expected data signal, a power of the expected data signal, a timing of the expected data signal, a waveform of the expected data signal, and/or a phase of the expected data signal.

It is within the scope of the present disclosure that the determining at 130 may be performed at any suitable time. As an illustrative, non-exclusive example, the determining at 130 may be performed prior to the providing at 120, prior to the charging at 140, and/or prior to the tuning at 150. As another illustrative, non-exclusive example, the determining at 130 also may be performed subsequent to the tuning at 150 and/or subsequent to the providing at 120.

Charging the data signal transmission line with the co-drive output signal at 140 may include charging at least a portion of the data signal transmission line based, at least in part, on the expected data signal. The co-drive output signal may be generated by a co-drive assembly that is separate from, spaced apart from, and/or different from the low power output driver. As such, methods 100 may include at least partially concurrently conveying and/or transferring two different electrical signals, the data signal and the co-drive output signal, with the data signal transmission line, and the combination of the data signal and the co-drive output signal also may be referred to herein as a composite data signal.

The charging at 140 may be based upon any suitable criteria. As an illustrative, non-exclusive example, the charging at 140 may include charging the portion of the data signal transmission line to a co-drive voltage that is based, at least in part, on an expected voltage of the expected data signal. Illustrative, non-exclusive examples of the co-drive voltage include co-drive voltages of at least 50%, at least 55%, at least 60%, at least 65%, at least 70%, at least 75%, at least 80%, at least 85%, and/or at least 90% of the expected voltage. Additional illustrative, non-exclusive examples of the co-drive voltage include co-drive voltages of less than 99%, less than 97.5%, less than 95%, less than 92.5%, less than 90%, less than 87.5%, less than 85%, less than 82.5%, and/or less than 80% of the expected voltage.

Thus, and as discussed in more detail herein, the co-drive output signal may supplement the data signal, thereby permitting the composite signal to be detected by the signal analyzer as a valid signal in a shorter time period when compared to methods that convey the data signal without supplementation with the co-drive output signal.

It is within the scope of the present disclosure that the charging at 140 may include (instantaneously, or at least substantially instantaneously) supplying the co-drive voltage to the portion of the data signal transmission line (i.e., without controlling, ramping, and/or actively regulating a rate of change of the voltage of the co-drive output signal). Additionally or alternatively, it also is within the scope of the present disclosure that the charging at 140 may include ramping the voltage of the co-drive output signal to the co-drive voltage (i.e., controlling and/or actively regulating the rate of change of the voltage of the co-drive output signal).

Additionally or alternatively, the charging at 140 also may utilize pre-emphasis of the co-drive output signal, such as to produce, or generate, a desired waveform for the composite data signal. As an illustrative, non-exclusive example, the charging at 140 may include selectively varying a waveform of the co-drive output signal base, at least in part, on the expected data signal (or an expected waveform of the expected data signal). As another illustrative, non-exclusive example, the charging at 140 also may include selectively varying the waveform of the co-drive output signal based, at least in part, on a desired waveform of the composite data signal.

The charging at 140 may be performed at any suitable time during methods 100, and the charging at 140 and the providing at 120 may not be concurrently initiated. As illustrative, non-exclusive examples, the charging at 140 may be performed and/or initiated subsequent to the tuning at 150, subsequent to the providing at 120, during the providing at 120, prior to the providing at 120, and/or subsequent to the determining at 130. As a more specific but still illustrative, non-exclusive example, and when a rise time for the co-drive output signal is greater than a rise time for the data signal, the charging at 140 may be performed prior to the providing at 120.

As another illustrative, non-exclusive example, the DUT may be loaded with a complete vector and/or memory test for a functional test and may function as a driver that is toggled by methods 100 and/or that is continuously clocked. Under these conditions, the charging at 140 may be performed before, during, and/or after generation of the data signal by the DUT. The timing, voltage, current, power, waveform, and/or phase of the co-drive output signal that is provided during the charging at 140 also may be adjusted and/or modified in real-time to tune the co-drive output signal (such as during the tuning at 150).

The charging at 140 may include charging such that the low power output driver provides at least a threshold fraction of the composite signal and/or transitions over at least a threshold fraction of a nominal output range thereof. As an illustrative, non-exclusive example, the charging at 140 may include timing the charging such that the low power output driver produces the data signal over at least a threshold fraction of a nominal voltage output range thereof. As another illustrative, non-exclusive example, the charging at 140 also may include timing the charging such that the low power output driver produces the data signal over at least a threshold fraction of a nominal current output range thereof.

Illustrative, non-exclusive examples of the threshold fraction of the nominal voltage output range include at least 75%, at least 80%, at least 85%, at least 90%, at least 95%, at least 97.5%, and/or at least 99% of the nominal voltage output range. Illustrative, non-exclusive examples of the threshold fraction of the nominal current output range include at least 75%, at least 80%, at least 85%, at least 90%, at least 95%, at least 97.5%, and/or at least 99% of the nominal current output range.

The charging at 140 further may include timing the charging such that the signal analyzer receives the data signal and the co-drive output signal concurrently, or at least substantially concurrently. The charging at 140 additionally or alternatively may include timing the charging such that the signal analyzer receives (or initially receives) the data signal and the co-drive output signal within a threshold time differential of one another. Illustrative, non-exclusive examples of the threshold time differential include threshold time differentials of less than 10 nanoseconds (ns), less than 8 ns, less than 6 ns, less than 5 ns, less than 4 ns, less than 3 ns, less than 2 ns, less than 1 ns, less than 0.5 ns, less than 0.25 ns, less than 0.1 ns, less than 0.05 ns, or less than 0.01 ns.

The co-drive output signal may be provided to the data signal transmission line in any suitable manner. As an illustrative, non-exclusive example, the co-drive output signal may be provided to a DUT-proximal end of the data signal transmission line, such as via any suitable co-drive conductor. The co-drive output signal then may be conveyed through the data transmission line to, or toward, the signal analyzer. As another illustrative, non-exclusive example, the co-drive output signal may be provided to a signal analyzer-proximal end of the data signal transmission line. The co-drive output signal then may be conveyed through the data signal transmission line, reflected near the DUT-proximal end of the data signal transmission line, and conveyed through the data signal transmission line to the signal analyzer.

The portion of the data signal transmission line may include and/or be any suitable portion, region, or subset of the data signal transmission line. As illustrative, non-exclusive examples, the data signal transmission line may include a signal conductor, which is configured to convey the data signal, and a guard conductor, which is configured to guard the data signal. Additionally, the portion of the data signal transmission line may include the signal conductor and/or the guard conductor. Thus, the charging at 140 may include charging the signal conductor, charging the guard conductor, or charging both the signal conductor and the guard conductor with the co-drive output signal.

As discussed, the charging at 140 includes charging the portion of the data signal transmission line based upon the expected data signal that is determined during the determining at 130. It is within the scope of the present disclosure that the charging at 140 may include determining any suitable property of the co-drive output signal and that the co-drive output signal may be determined at any suitable time, such as a time that is subsequent to the determining at 130. As illustrative, non-exclusive examples, the co-drive output signal may be determined prior to the tuning at 150, during the tuning at 150, and/or subsequent to the tuning at 150. As additional illustrative, non-exclusive examples, the co-drive output signal also may be determined prior to the providing at 120, during the providing at 120, and/or subsequent to the providing at 120. It also is within the scope of the present disclosure that one or more steps of methods 100, such as the tuning at 150 and/or the providing at 120, may be performed subsequent to determining the co-drive output signal and prior to charging the portion of the data signal transmission line with the co-drive output signal.

Tuning the co-drive output signal at 150 may include adjusting and/or modifying the co-drive output signal in any suitable manner and/or based upon any suitable criteria. As an illustrative, non-exclusive example, the tuning at 150 may include adjusting one or more properties of the co-drive output signal. Illustrative, non-exclusive examples of properties of the co-drive output signal include a co-drive voltage of the co-drive output signal, a co-drive current of the co-drive output signal, a timing of the co-drive output signal, a waveform of the co-drive output signal, and/or a phase of the co-drive output signal. As another illustrative, non-exclusive example, the tuning at 150 may include varying, adjusting, and/or modifying the co-drive voltage and/or a ramp rate of a voltage of the co-drive output signal when transitioning to the co-drive voltage.

The tuning at 150 may include tuning to modify, adjust, improve, and/or optimize any suitable property of the electrical test. As an illustrative, non-exclusive example, the tuning at 150 may include adjusting the co-drive output signal to increase a signal-to-noise ratio for detection of the data signal and/or the composite data signal by the signal analyzer. As another illustrative, non-exclusive example, the tuning at 150 also may include adjusting the co-drive output signal to decrease a bit error rate for detection of the data signal and/or the composite data signal by the signal analyzer.

The tuning at 150 also may include adjusting any suitable property of a test system that is performing method 100. As an illustrative, non-exclusive example, the tuning at 150 may include temporarily and/or selectively grounding a signal analyzer-proximal end of the guard conductor that forms a portion of the data signal transmission line and/or that is configured to guard the data signal.

As another illustrative, non-exclusive example, the tuning at 150 also may include establishing an electrical open, an electrical short, and/or a load at the signal analyzer-proximal end and/or at a DUT-proximal end of the guard conductor. Forming the electrical open may include electrically isolating the guard conductor from the DUT, from a DUT ground, from a signal processor ground, and/or from a ground plane. Forming the electrical short may include electrically connecting the guard conductor to the DUT, to the DUT ground, to the signal processor ground, and/or to the ground plane. Forming the load may include establishing any suitable electrical load between the guard conductor and the DUT, the DUT ground, the signal processor ground, and/or the ground plane.

As yet another illustrative, non-exclusive example, the tuning at 150 also may include establishing an electrical open, an electrical short, and/or a load at a signal analyzer-proximal end and/or at a DUT-proximal end of the signal conductor that forms a portion of the data transmission line. Forming the electrical open may include electrically isolating the signal conductor from the DUT, from a DUT ground, from a signal processor ground, from a ground plane, and/or from the guard conductor. Forming the electrical short may include electrically connecting the signal conductor to the DUT, to the DUT ground, to the signal processor ground, to the ground plane, and/or to the guard conductor. Forming the load may include establishing any suitable electrical load between the signal conductor and the DUT, the DUT ground, the signal processor ground, the ground plane, and/or the guard conductor.

As another illustrative, non-exclusive example, the tuning at 150 also may include applying any suitable input signal, combination of input signals, and/or pattern of input signals to one of the signal conductor and the guard conductor. Under these conditions, the tuning at 150 further may include concurrently measuring a response of the other of the signal conductor and the guard conductor. The input signals may be applied with any suitable voltage, current, rise time, waveform, frequency, and/or frequency range, and the tuning at 150 may include varying the voltage, current, rise time, waveform, frequency, and/or frequency range of the input signals to facilitate the tuning.

It is within the scope of the present disclosure that the tuning at 150 may be performed prior to the providing at 120 and/or prior to each occurrence of the providing at 120. Additionally or alternatively, the tuning at 150 also may be performed prior to, or during, engineering characterization work and/or subsequent to construction of a test system that is configured to utilize methods 100. As further additional or alternative examples, the tuning at 150 also may be performed concurrently with at least a portion of methods 100, such as during the providing at 120, during the determining at 130, during the charging at 140, and/or during the receiving at 170.

Results of the turning at 150 may be stored and/or utilized at a later date to improve detection of the composite data signals that are received during the receiving at 170. This may include storing the results in any suitable electronic media, lookup table, and/or lookup file.

As an illustrative, non-exclusive example, the tuning at 150 may include tuning to calibrate a probe head that includes the data signal transmission line. Under these conditions methods 100 may include performing the tuning at 150 while electrically testing a first DUT. The tuning at 150 further may include selecting a target value for at least one property of the co-drive output signal, with the target value being based, at least in part, on the tuning at 150. Methods 100 then may include storing the target value of the at least one property of the co-drive output signal and repeating methods 100 to subsequently test a second DUT that is different than the first DUT. When testing the second DUT, methods 100 may maintain the at least one property of the co-drive output signal at, or near, the target value.

Electrically isolating the signal analyzer from the co-drive output signal at 160 may include temporarily and/or selectively isolating the signal analyzer from the co-drive output signal. As an illustrative, non-exclusive example, and when the charging at 140 includes charging the signal conductor and/or providing the co-drive output signal to the signal analyzer-proximal end of the data signal transmission line, the isolating at 160 may include isolating the signal analyzer from the co-drive output signal during the charging at 140.

Receiving the composite data signal with the signal analyzer at 170 may include receiving the composite data signal that includes both the data signal and the co-drive output signal. The composite data signal may be received in any suitable manner. As an illustrative, non-exclusive example, the receiving at 170 may include receiving the data signal via the signal conductor. As another illustrative, non-exclusive example, the receiving at 170 also may include receiving the co-drive output signal via the signal conductor. Additionally or alternatively, the receiving at 170 also may include receiving the co-drive output signal via the guard conductor.

Filtering the composite data signal at 180 may include filtering the composite data signal in any suitable manner. As an illustrative, non-exclusive example, the filtering at 180 may include filtering to improve reception and/or detection of the data signal. As another illustrative, non-exclusive example, the filtering at 180 may include filtering to separate the data signal from the co-drive output signal and subsequently analyzing the data signal with the signal analyzer. As yet another illustrative, non-exclusive example, the filtering at 180 also may include filtering to separate the co-drive output signal from the composite data signal, thereby producing a filtered composite data signal, with filtering 180 and/or method 100 subsequently analyzing the filtered composite data signal with the signal analyzer. As another illustrative, non-exclusive example, the filtering at 180 also may include digital signal processing (DSP) of the composite data signal.

Analyzing the data signal at 190 may include analyzing the data signal, the composite data signal, and/or the filtered composite data signal in any suitable manner. As an illustrative, non-exclusive example, the analyzing at 190 may include comparing a voltage of the composite data signal to an expected voltage of the composite data signal. As another illustrative, non-exclusive example, the analyzing at 190 also may include comparing a timing of the composite data signal to an expected timing of the composite data signal. As yet another illustrative, non-exclusive example, the analyzing at 190 also may include comparing a waveform of the composite data signal to an expected waveform of the composite data signal.

It is within the scope of the present disclosure that the analyzing at 190 further may include measuring the composite data signal. This may include measuring the composite data signal relative to any suitable reference point, reference voltage, and/or reference signal. As illustrative, non-exclusive examples, the composite data signal may be measured relative to ground, relative to a guard potential, and/or relative to a potential of the guard conductor.

The analyzing at 190 further may include processing the composite data signal in any suitable manner. As illustrative, non-exclusive examples, the processing may include processing to compensate for system noise and/or for crosstalk among a plurality of signal transmission lines that may be present within the test system.

Methods 100 have been discussed herein in the context of a DUT that is in communication with a signal generator via a single input signal transmission line and that includes a single low power output driver that is in communication with a signal analyzer via a single data signal transmission line. However, it is within the scope of the present disclosure that methods 100 may be utilized with a DUT that includes a plurality of low power output drivers. Thus, the providing at 120 may include providing a plurality of input signals to the DUT via a respective plurality of input signal transmission lines, the determining at 130 may include determining a plurality of respective expected data signals to be received from the plurality of low power output drivers via a respective plurality of data signal transmission lines, the charging at 140 may include charging the plurality of data signal transmission lines with a plurality of respective co-drive output signals of a plurality of respective co-drive assemblies, and/or the receiving at 170 may include receiving a plurality of respective composite data signals with the signal analyzer.

Under these conditions, methods 100 further may include selectively varying which of the plurality of data signal transmission lines concurrently receives or transmits the plurality of data signals, the plurality of respective co-drive output signals, and/or the plurality of respective composite data signals. As illustrative, non-exclusive examples, the selectively varying may include selectively varying to decrease crosstalk among the plurality of data signal transmission lines and/or to improve a signal-to-noise ratio of the plurality of composite data signals.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

In the event that any patents, patent applications, or other references are incorporated by reference herein and define a term in a manner or are otherwise inconsistent with either the non-incorporated portion of the present disclosure or with any of the other incorporated references, the non-incorporated portion of the present disclosure shall control, and the term or incorporated disclosure therein shall only control with respect to the reference in which the term is defined and/or the incorporated disclosure was originally present.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It also is within the scope of the present disclosure that elements, components, and/or other recited subject matter that is recited as being adapted to perform a particular function may additionally or alternatively be described as being configured to perform that function, and vice versa.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of electrically testing a device under test (DUT) having a low power output driver, the method comprising:

providing an input signal to the DUT, wherein the low power output driver is configured to generate a data signal responsive to receipt of the input signal by the DUT and to provide the data signal to a signal analyzer via a data signal transmission line;

determining an expected data signal to be received from the low power output driver;

charging at least a portion of the data signal transmission line with a co-drive output signal of a co-drive assembly that is different from the low power output driver, wherein the charging is based, at least in part, on the expected data signal; and receiving a composite data signal that includes the data signal and the co-drive output signal with the signal analyzer via the data signal transmission line.

A2. The method of paragraph A1, wherein the determining the expected data signal includes calculating a characteristic of the expected data signal.

A3. The method of paragraph A2, wherein the characteristic of the expected data signal includes at least one, optionally at least two, optionally at least three, and further optionally all of a voltage of the expected data signal, a current of the expected data signal, a power of the expected data signal, and a timing of the expected data signal.

A4. The method of any of paragraphs A1-A3, wherein the determining the expected data signal includes determining the expected data signal based, at least in part, on at least one, optionally at least two, optionally at least three, optionally at least four, and further optionally all of the input signal, a magnitude of the input signal, a voltage of the input signal, a current of the input signal, and an architecture of the DUT.

A5. The method of any of paragraphs A1-A3, wherein the determining the expected data signal includes at least one, and optionally both, of modeling the DUT to estimate the expected data signal and measuring a preliminary data signal that is produced by the DUT responsive to receipt of a preliminary input signal.

A6. The method of any of paragraphs A1-A5, wherein the charging includes charging to a co-drive voltage that is based, at least in part, on an expected voltage of the expected data signal.

A7. The method of paragraph A6, wherein the co-drive voltage is at least one of:

(i) at least 50%, at least 55%, at least 60%, at least 65%, at least 70%, at least 75%, at least 80%, at least 85%, or at least 90% of the expected voltage;

(ii) less than 125%, less than 120%, less than 115%, less than 110%, less than 105%, less than 100%, less than 99%, less than 97.5%, less than 95%, less than 92.5%, less than 90%, less than 87.5%, less than 85%, less than 82.5%, or less than 80% of the expected voltage; and (iii) a range bounded by one of the co-drive voltages of (i) and one of the co-drive voltages of (ii).

A8. The method of any of paragraphs A6-A7, wherein the charging further includes supplying the co-drive voltage to the portion of the data signal transmission line.

A9. The method of any of paragraphs A6-A8, wherein the charging further includes ramping a voltage of the co-drive output signal to the co-drive voltage.

A10. The method of any of paragraphs A1-A9, wherein the low power output driver defines a nominal voltage output range and a nominal current output range, and further wherein the charging includes timing the charging such that the low power output driver produces the data signal over at least a threshold fraction of the nominal voltage output range and over at least a threshold fraction of the nominal current output range.

A11. The method of paragraph A10, wherein the threshold fraction of the nominal voltage output range is at least 75%, at least 80%, at least 85%, at least 90%, at least 95%, at least 97.5%, or at least 99% of the nominal voltage output range.

A12. The method of any of paragraphs A10-A11, wherein the threshold fraction of the nominal current output range is at least 75%, at least 80%, at least 85%, at least 90%, at least 95%, at least 97.5%, or at least 99% of the nominal current output range.

A13. The method of any of paragraphs A1-A12, wherein the charging includes timing the charging such that the signal analyzer receives the data signal and the co-drive output signal at least substantially concurrently, and optionally concurrently.

A14. The method of any of paragraphs A1-A13, wherein the charging includes timing the charging such that the signal analyzer receives the data signal and the co-drive output signal within a threshold time differential of one another, optionally wherein the threshold time differential is less than 10 nanoseconds (ns), less than 8 ns, less than 6 ns, less than 5 ns, less than 4 ns, less than 3 ns, less than 2 ns, less than 1 ns, less than 0.5 ns, less than 0.25 ns, less than 0.1 ns, less than 0.05 ns, or less than 0.01 ns.

A15. The method of any of paragraphs A1-A14, wherein the providing and the charging are not concurrently initiated.

A16. The method of any of paragraphs A1-A15, wherein the charging is initiated prior to the providing.

A17. The method of any of paragraphs A1-A15, wherein the charging is initiated subsequent to the providing.

A18. The method of any of paragraphs A1-A17, wherein the method further includes selectively varying a waveform of the co-drive output signal based, at least in part, on the expected data signal.

A19. The method of any of paragraphs A1-A18, wherein the method further includes selectively varying a/the waveform of the co-drive output signal based, at least in part, on a desired waveform of the composite data signal.

A20. The method of any of paragraphs A1-A19, wherein the data signal transmission line includes a DUT-proximal end, a signal analyzer-proximal end, and an electrical conductor that extends between the DUT-proximal end and the signal analyzer-proximal end.

A21. The method of paragraph A20, wherein the charging includes providing the co-drive output signal to the DUT-proximal end, optionally via a co-drive conductor, and conveying the co-drive output signal through the electrical conductor to the signal analyzer.

A22. The method of paragraph A20, wherein the charging includes providing the co-drive output signal to the signal analyzer-proximal end, conveying the co-drive output signal through the electrical conductor to the DUT, reflecting the co-drive output signal near the DUT, and conveying the co-drive output signal through the electrical conductor to the signal analyzer.

A23. The method of paragraph A22, wherein the method further includes electrically isolating the signal analyzer from the co-drive output signal during the providing the co-drive output signal to the signal analyzer-proximal end.

A24. The method of any of paragraphs A22-A23, wherein a length of the electrical conductor is not an integer multiple of a wavelength of the co-drive output signal, and further wherein the method includes conveying the co-drive output signal along the length of the electrical conductor.

A25. The method of paragraph A24, wherein the method further includes selecting the length of the electrical conductor such that the length of the electrical conductor is not an integer multiple of the wavelength of the co-drive output signal.

A26. The method of any of paragraphs A22-A25, wherein a/the length of the electrical conductor is an integer multiple of a/the wavelength of the co-drive output signal plus a threshold fraction of the wavelength of the co-drive output signal.

A27. The method of paragraph A26, wherein the threshold fraction of the wavelength of the co-drive output signal is:

(i) at least 25%, at least 30%, at least 35%, at least 40%, at least 45%, or at least 50% of the wavelength of the co-drive output signal;

(ii) less than 75%, less than 70%, less than 65%, less than 60%, less than 55%, or less than 50% of the wavelength of the co-drive output signal;

(iii) a range that is bounded by one of the threshold fractions of (i) and one of the threshold fractions of (ii); and/or (iv) 50% of the wavelength of the co-drive output signal.

A28. The method of any of paragraphs A1-A27, wherein the data signal transmission line includes a signal conductor, which is configured to convey the data signal, and a guard conductor, which provides a guard for the data signal, and further wherein the receiving includes receiving the data signal from the signal conductor.

A29. The method of paragraph A28, wherein the portion of the data signal transmission line includes the signal conductor.

A30. The method of any of paragraphs A28-A29, wherein the portion of the data signal transmission line includes the guard conductor.

A31. The method of any of paragraphs A28-A30, wherein the co-drive output signal includes a signal conductor co-drive output signal and a guard conductor co-drive output signal, and further wherein the charging includes charging the signal conductor with the signal conductor co-drive output signal and charging the guard conductor with the guard conductor co-drive output signal.

A32. The method of any of A28-A31, wherein the guard conductor is a dedicated guard conductor that does not provide a guard for another signal conductor.

A33. The method of any of paragraphs A28-A32, wherein the guard conductor provides a guard for a single signal conductor.

A34. The method of any of paragraphs A28-A33, wherein the guard conductor is not in electrical communication with a DUT ground of the DUT.

A35. The method of any of paragraphs A28-A33, wherein the guard conductor is in indirect electrical communication with a DUT ground of the DUT.

A36. The method of paragraph A35, wherein at least one, optionally at least two, and further optionally all, of a resistor, a capacitor, and an inductor electrically separates the guard conductor from the DUT ground.

A37. The method of any of paragraphs A1-A36, wherein the method further includes tuning the co-drive output signal.

A38. The method of paragraph A37, wherein the tuning includes adjusting at least one property of the co-drive output signal, optionally wherein the at least one property of the co-drive output signal includes at least one, optionally at least two, optionally at least three, optionally at least four, and further optionally all, of a/the co-drive voltage of the co-drive output signal, a co-drive current of the co-drive output signal, a timing of the co-drive output signal, a phase of the co-drive output signal, and a waveform of the co-drive output signal.

A39. The method of paragraph A38, wherein the DUT is a first DUT, wherein the tuning includes tuning to calibrate a probe head that includes the data signal transmission line while electrically testing the first DUT, and further wherein the method includes:

(i) selecting a target value of the at least one property of the co-drive output signal based, at least in part, on the tuning;

(ii) storing the target value of the at least one property of the co-drive output signal; and (iii) repeating the method to electrically test a second DUT, wherein the repeating includes performing the method while maintaining the at least one property of the co-drive output signal at the target value.

A40. The method of any of paragraphs A37-A39, wherein the tuning includes varying at least one, and optionally both, of a/the co-drive voltage of the co-drive output signal and a ramp rate of a voltage of the co-drive output signal when transitioning to the co-drive voltage.

A41. The method of any of paragraphs A37-A40, wherein the tuning includes adjusting the co-drive output signal to increase a signal-to-noise ratio for detection of the data signal by the signal analyzer.

A42. The method of any of paragraphs A37-A41, wherein the tuning includes temporarily grounding a/the signal analyzer-proximal end of a/the guard conductor during the tuning.

A43. The method of any of paragraphs A37-A42, wherein the tuning includes adjusting the co-drive output signal to decrease a bit error rate for detection of the data signal by the signal analyzer.

A44. The method of any of paragraphs A1-A43, wherein the method further includes analyzing the data signal with the signal analyzer.

A45. The method of paragraph A44, wherein the analyzing includes at least one, optionally at least two, and further optionally all of:
(i) comparing a voltage of the composite data signal to an expected voltage of the composite data signal;
(ii) comparing a timing of the composite data signal to an expected timing of the composite data signal; and
(iii) comparing a waveform of the composite data signal to an expected waveform of the composite data signal.

A46. The method of any of paragraphs A44-A45, wherein the method further includes filtering the composite data signal to separate the data signal from the co-drive output signal, and further wherein the analyzing includes analyzing the data signal subsequent to the filtering, optionally wherein the filtering includes digital signal processing of the composite data signal.

A47. The method of any of paragraphs A1-A46, wherein the low power output driver is a first low power output driver, wherein the DUT includes a plurality of low power output drivers, wherein the determining includes determining a plurality of respective expected data signals to be received from the plurality of low power output drivers via a respective plurality of data signal transmission lines, wherein the charging includes charging the respective plurality of data signal transmission lines with a plurality of respective co-drive output signals of a plurality of respective co-drive assemblies, and further wherein the receiving includes receiving a plurality of respective composite data signals with the signal analyzer.

A48. The method of paragraph A47, wherein the method further includes selectively varying which of the plurality of data signal transmission lines concurrently receive the plurality of respective co-drive output signals to decrease crosstalk among the plurality of data signal transmission lines.

A49. The method of any of paragraphs A1-A48, wherein the providing includes providing via at least one of:
(i) an input signal transmission line;
(ii) an input signal electrical conduit;
(iii) a wired input signal;
(iv) a wireless input signal; and
(v) an internally generated input signal that is generated within the DUT.

A50. The method of any of paragraphs A1-A49, wherein the input signal includes at least one of:
(i) a power supply signal;
(ii) a logic signal; and
(iii) a self-test initiation signal.

A51. The method of any of paragraphs A1-A50, wherein the method further includes synchronizing the signal analyzer with the DUT.

A52. The method of paragraph A51, wherein the synchronizing includes at least one of:
(i) detecting a clock signal of the DUT with the signal analyzer;
(ii) detecting a clock signal of the input signal with the signal analyzer; and
(iii) providing a/the preliminary input signal to the DUT and detecting a resultant preliminary data signal from the DUT prior to performing the determining, the charging, and the receiving.

B1. A probe head for electrically testing a device under test (DUT) having a plurality of low power output drivers, the probe head comprising:
a plurality of data signal transmission lines configured to convey a plurality of data signals from the plurality of low power output drivers to a signal generation and analysis assembly (SGAA), wherein each of the plurality of data signal transmission lines includes a DUT-proximal end and a SGAA-proximal end; and
a plurality of co-drive conductors, wherein each of the plurality of co-drive conductors is in electrical communication with a respective one of the plurality of data signal transmission lines and is configured to provide a respective co-drive output signal to the respective one of the plurality of data signal transmission lines, wherein the respective co-drive output signal is based, at least in part, on an expected value of a respective data signal of the plurality of data signals to be conveyed by the respective one of the plurality of data signal transmission lines.

B2. The probe head of paragraph B1, wherein each of the plurality of data signal transmission lines includes a signal conductor and a corresponding guard conductor, wherein the signal conductor extends between the DUT-proximal end and the SGAA-proximal end.

B3. The probe head of paragraph B2, wherein the corresponding guard conductor extends at least partially between the DUT-proximal end and the SGAA-proximal end.

B4. The probe head of paragraph B3, wherein the corresponding guard conductor extends along at least a threshold fraction of a length of the data signal transmission line, optionally wherein the threshold fraction includes at least 50%, at least 60%, at least 70%, at least 80%, at least 90%, at least 95%, at least 97.5%, or at least 99% of the length of the data signal transmission lines.

B5. The probe head of any of paragraphs B1-B4, wherein the plurality of data signal transmission lines includes a plurality of signal conductors and a corresponding plurality of guard conductors.

B6. The probe head of paragraph B5, wherein each of the plurality of guard conductors guards a respective one, and optionally only one, of the plurality of signal conductors.

B7. The probe head of any of paragraphs B1-B6, wherein each of the plurality of co-drive conductors is directly attached to and in electrical communication with the DUT-proximal end of the respective one of the plurality of data signal transmission lines.

B8. The probe head of any of paragraphs B1-B7, wherein the respective one of the plurality of data signal transmission lines is configured to convey the respective co-drive output signal from the DUT-proximal end to the SGAA-proximal end at least partially concurrently with conveyance of a respective data signal of the plurality of data signals.

B9. The probe head of any of paragraphs B7-B8, wherein each of the plurality of co-drive conductors is directly attached to and in electrical communication with a respective guard conductor of the respective one of the plurality of data signal transmission lines.

B10. The probe head assembly of paragraph B9, wherein the respective guard conductor is electrically isolated from a DUT ground of the DUT.

B11. The probe head assembly of paragraph B9, wherein the respective guard conductor is in indirect electrical communication with a DUT ground of the DUT.

B12. The probe head assembly of paragraph B11, wherein an electrical element electrically separates the respective guard conductor from the DUT ground.

B13. The probe head of paragraph B12, wherein the electrical element includes at least one, optionally at least two, optionally at least three, and further optionally all, of a resistor, a capacitor, an inductor, and a transistor.

B14. The probe head of any of paragraphs B12-B13, wherein the electrical element extends between a SGAA-proximal end of the respective guard conductor and the DUT ground.

B15. The probe head of any of paragraphs B7-B8, wherein each of the plurality of co-drive conductors is directly attached to and in electrical communication with a respective signal conductor of the respective one of the plurality of data signal transmission lines.

B16. The probe head of any of paragraphs B1-B6, wherein each of the plurality of co-drive conductors is directly attached to and in electrical communication with the SGAA-proximal end of the respective one of the plurality of data signal transmission lines.

B17. The probe head of any of paragraphs B1-B6 or B16, wherein the respective one of the plurality of data signal transmission lines is configured to convey the respective co-drive output signal from the SGAA-proximal end to the DUT-proximal end, to reflect the respective co-drive output signal, and to return the respective co-drive output signal to the SGAA-proximal end at least partially concurrently, and optionally concurrently, with conveyance of a respective data signal of the plurality of data signals.

B18. The probe head of any of paragraphs B16-B17, wherein each of the plurality of co-drive conductors is directly attached to and in electrical communication with a respective guard conductor of the respective one of the plurality of data signal transmission lines.

B19. The probe head assembly of paragraph B18, wherein the respective guard conductor is electrically isolated from a DUT ground of the DUT.

B20. The probe head of any of paragraphs B16-B17, wherein each of the plurality of co-drive conductors is directly attached to and in electrical communication with a respective signal conductor of the respective one of the plurality of data signal transmission lines.

B21. The probe head of paragraph B20, wherein the probe head further includes an isolation device that electrically isolates the SGAA from the respective co-drive output signal when the respective co-drive output signal is provided to the respective signal conductor.

B22. The probe head of paragraph B21, wherein the isolation device includes at least one of a directional coupler, a matrix directional coupler, and a four-way coupler.

B23. The probe head of any of paragraphs B1-B22, wherein a length of each of the plurality of data signal transmission lines is not an integer multiple of a wavelength of a respective co-drive output signal that is conveyed therein.

B24. The probe head of any of paragraphs B1-B23, wherein a/the length of each of the plurality of data signal transmission lines is an integer multiple of a/the wavelength of the co-drive output signal that is conveyed therein plus a threshold fraction of the wavelength of the co-drive output signal.

B25. The probe head of paragraph B24, wherein the threshold fraction of the wavelength of the co-drive output signal is:
  (i) at least 25%, at least 30%, at least 35%, at least 40%, at least 45%, or at least 50% of the wavelength of the co-drive output signal;
  (ii) less than 75%, less than 70%, less than 65%, less than 60%, less than 55%, or less than 50% of the wavelength of the co-drive output signal;
  (iii) any range that is bounded by one of the threshold fractions of (i) and one of the threshold fractions of (ii); and
  (iv) 50% of the wavelength of the co-drive output signal.

B26. The probe head of any of paragraphs B1-B25, wherein the probe head further includes an input signal supply structure configured to convey an input signal from the SGAA to the DUT, wherein the plurality of low power output drivers is configured to generate the plurality of data signals responsive to receipt of the input signal by the DUT.

B27. The probe head of paragraph B26, wherein the input signal includes at least one of:
  (i) a power supply signal;
  (ii) a logic signal; and
  (iii) a self-test initiation signal.

B28. The probe head of any of paragraphs B26-B27, wherein the input signal supply structure includes at least one of:
  (i) an input signal transmission line;
  (ii) an input signal electrical conduit;
  (iii) an input signal optical conduit;
  (iv) a wired input signal supply structure; and
  (v) a wireless input signal supply structure.

C1. A test system for electrically testing a device under test (DUT) having a plurality of low power output drivers, the test system comprising:
  a signal generation and analysis assembly (SGAA); and
  the probe head of any of paragraphs B1-B28.

C2. The test system of paragraph C1, wherein the test system further includes a co-drive assembly that is configured to provide a plurality of co-drive output signals to the plurality of co-drive conductors.

C3. The test system of paragraph C2, wherein the plurality of co-drive output signals is configured to combine with the plurality of data signals to generate a plurality of composite data signals, and further wherein the test system includes a filter that is configured to separate the plurality of co-drive output signals from the plurality of composite signals to generate a plurality of filtered composite signals that correspond to the plurality of data signals, wherein the test system is configured to provide the plurality of filtered composite signals to the SGAA.

C4. The test system of any of paragraphs C2-C3, wherein the co-drive assembly is configured to determine a plurality of expected data signals to be generated by the plurality of low power output drivers, and further wherein a magnitude of the plurality of co-drive output signals is based, at least in part, on the plurality of expected data signals.

C5. The test system of any of paragraphs C1-C4, wherein the probe head is configured to convey the plurality of input signals from the SGAA to the DUT.

C6. The test system of any of paragraphs C1-05, wherein the probe head is configured to convey the plurality of data signals from the plurality of low power output drivers to the SGAA.

C7. The test system of any of paragraphs C1-C6, wherein the test system further includes a controller that is programmed to control the operation of the test system using the method of any of paragraphs A1-A52.

D1. The method of any of paragraphs A1-A52, the probe head of any of paragraphs B1-B25, or the test system of any of paragraphs C1-C7, wherein at least one of a/the data signal transmission line and a/the plurality of data signal transmission lines includes an impedance of at least one of:

(i) greater than 75 ohms, greater than 80 ohms, greater than 85 ohms, greater than 90 ohms, or greater than 95 ohms;

(ii) less than 125 ohms, less than 120 ohms, less than 115 ohms, less than 110 ohms, or less than 105 ohms; and (iii) a range that is bounded by one of the impedances of (i) and one of the impedances of (ii).

D2. The method of any of paragraphs A1-A52 or D1, the probe head of any of paragraphs B1-B25 or D1, or the test system of any of paragraphs C1-C7 or D1, wherein at least one of a/the low power output driver and a/the plurality of low power output drivers generates an output current of at least one of:

(i) greater than 0.1 milliamps (mA), greater than 0.2 mA, greater than 0.3 mA, greater than 0.4 mA, greater than 0.5 mA, greater than 0.75 mA, greater than 1 mA, greater than 1.25 mA, or greater than 1.5 mA;

(ii) less than 10 mA, less than 9 mA, less than 8 mA, less than 7 mA, less than 6 mA, less than 5 mA, less than 4 mA, less than 3 mA, less than 2.5 mA, less than 2.25 mA, less than 2 mA, less than 1.75 mA, less than 1.5 mA, less than 1.25 mA, or less than 1 mA; and (iii) a range that is bounded by one of the output currents of (i) and one of the output currents of (ii).

E1. The use of any of the methods of any of paragraphs A1-A52 or D1-D2 with any of the probe heads of any of paragraphs B1-B28 or D1-D2 or any of the test systems of any of paragraphs C1-C7 or D1-D2.

E2. The use of any of the probe heads of any of paragraphs B1-B28 or D1-D2 or any of the test systems of any of paragraphs C1-C7 or D1-D2 with any of the methods of any of paragraphs A1-A52 or D1-D2.

E3. The use of any of the methods of any of paragraphs A1-A52 or D1-D2, any of the probe heads of any of paragraphs B1-B28 or D1-D2, or any of the test systems of any of paragraphs C1-C7 or D1-D2 to electrically test a device under test that includes a plurality of low power output drivers.

INDUSTRIAL APPLICABILITY

The systems and methods disclosed herein are applicable to the semiconductor and semiconductor test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, when the disclosure, the preceding numbered paragraphs, or subsequently filed claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A probe head for electrically testing a device under test (DUT) having a plurality of low power output drivers, the probe head comprising:

a plurality of data signal transmission lines configured to convey a plurality of data signals from the plurality of low power output drivers to a signal generation and analysis assembly (SGAA), wherein each of the plurality of data signal transmission lines includes a DUT-proximal end, and a SGAA-proximal end;

an input signal supply structure configured to convey an input signal from the SGAA to the DUT, wherein the plurality of low power output drivers is configured to generate the plurality of data signals responsive to receipt of the input signal by the DUT; and a plurality of co-drive conductors, wherein each of the plurality of co-drive conductors is in electrical communication with a respective one of the plurality of data signal transmission lines and is configured to provide a respective co-drive output signal to the respective one of the plurality of data signal transmission lines, wherein the respective co-drive output signal is based, at least in part, on an expected value of a respective data signal of the plurality of data signals to be conveyed by the respective one of the plurality of data signal transmission lines.

2. The probe head of claim 1, wherein each of the plurality of data signal transmission lines includes a signal conductor and a corresponding guard conductor, wherein the signal conductor extends between the DUT-proximal end and the SGAA-proximal end.

3. The probe head of claim 1, wherein each of the plurality of co-drive conductors is directly attached to and in electrical communication with the DUT-proximal end of the respective one of the plurality of data signal transmission lines.

4. The probe head of claim 3, wherein each of the plurality of co-drive conductors is directly attached to and in electrical communication with a respective guard conductor of the respective one of the plurality of data signal transmission lines.

5. The probe head of claim 3, wherein each of the plurality of co-drive conductors is directly attached to and in electrical communication with a respective signal conductor of the respective one of the plurality of data signal transmission lines.

6. The probe head of claim 1, wherein each of the plurality of co-drive conductors is directly attached to and in electrical communication with the SGAA-proximal end of the respective one of the plurality of data signal transmission lines.

7. The probe head of claim 6, wherein each of the plurality of co-drive conductors is directly attached to and in electrical communication with a respective guard conductor of the respective one of the plurality of data signal transmission lines.

8. The probe head of claim 6, wherein each of the plurality of co-drive conductors is directly attached to and in electrical communication with a respective signal conductor of the respective one of the plurality of data signal transmission lines.

9. A test system for electrically testing a device under test (DUT) having a plurality of low power output drivers, the test system comprising:
   a signal generation and analysis assembly (SGAA);
   the probe head of claim 1; and
   a co-drive assembly that is configured to provide a plurality of co-drive output signals to the plurality of co-drive conductors.

10. The probe head of claim 1, wherein a length of each of the plurality of data signal transmission lines is an integer multiple of a wavelength of the co-drive output signal that is conveyed therein plus a threshold fraction of the wavelength of the co-drive output signal.

11. The probe head of claim 10, wherein the threshold fraction of the wavelength of the co-drive output signal is at least 25% and less than 75% of the wavelength of the co-drive output signal.

\* \* \* \* \*